US012030138B2

(12) United States Patent
Iacob et al.

(10) Patent No.: US 12,030,138 B2
(45) Date of Patent: Jul. 9, 2024

(54) COMPOSITE SOLDER BALLS METALLISED ON THE SURFACE AND CALIBRATED FOR THE ASSEMBLY OF ELECTRONIC BOARDS

(71) Applicant: LIFCO INDUSTRIE, Saint-Etienne (FR)

(72) Inventors: Constantin Iacob, Saint Georges sur Fontaine (FR); Sébastien Bucher, Saint Etienne (FR)

(73) Assignee: LIPCO INDUSTRIE, Saint-Etienne (FR)

( * ) Notice: Subject to any disclaimer, the term of this patent is extended or adjusted under 35 U.S.C. 154(b) by 206 days.

(21) Appl. No.: 17/642,617

(22) PCT Filed: Sep. 11, 2020

(86) PCT No.: PCT/EP2020/075498
§ 371 (c)(1),
(2) Date: Mar. 11, 2022

(87) PCT Pub. No.: WO2021/048374
PCT Pub. Date: Mar. 18, 2021

(65) Prior Publication Data
US 2022/0339742 A1 Oct. 27, 2022

(30) Foreign Application Priority Data
Sep. 12, 2019 (FR) ..................................... 1910055

(51) Int. Cl.
*B23K 35/02* (2006.01)
*B23K 35/30* (2006.01)
(Continued)

(52) U.S. Cl.
CPC ...... *B23K 35/0222* (2013.01); *B23K 35/3006* (2013.01); *B23K 35/302* (2013.01);
(Continued)

(58) Field of Classification Search
CPC ............ B23K 35/0222; B23K 35/3006; B23K 35/302; B23K 35/3033; H05K 1/0271;
(Continued)

(56) References Cited

U.S. PATENT DOCUMENTS 6,110,823 A * 8/2000 Eldridge ................. H01L 24/12
257/E21.507
6,340,113 B1 * 1/2002 Avery ................... B23K 35/025
228/248.1
(Continued)

FOREIGN PATENT DOCUMENTS

| JP | 2007044718 A | 2/2007 |
|---|---|---|
| JP | 6500583 B2 | 4/2019 |
| WO | 2021048374 A1 | 3/2021 |

OTHER PUBLICATIONS

Foreign Communication from a Related Counterpart Application, International Search Report dated Dec. 7, 2020, International Application No. PCT/EP2020/075498 filed on Sep. 11, 2020.
(Continued)

*Primary Examiner* — Anatoly Vortman

(57) ABSTRACT

The present invention relates to a method for manufacturing composite solder balls that are metallized on the surface and calibrated, these balls comprising a core consisting of a spherical support particle of diameter $D_0$ made of expanded polystyrene and having an intergranular porosity of at least 50%, and a shell covering said support particle and formed by a plurality of metallic surface layers. The present invention also relates to balls that can be obtained by the method according to the invention, as well as to the use thereof for the assembly of electronic boards.

6 Claims, 5 Drawing Sheets

(51) Int. Cl.
    *H05K 1/02*           (2006.01)
    *H05K 3/34*           (2006.01)

(52) U.S. Cl.
    CPC ....... *B23K 35/3033* (2013.01); *H05K 1/0271* (2013.01); *H05K 3/3436* (2013.01); *H05K 3/3473* (2013.01); *H05K 2201/10734* (2013.01); *H05K 2203/0435* (2013.01)

(58) Field of Classification Search
    CPC ............... H05K 3/3436; H05K 3/3473; H05K 2201/10734; H05K 2203/0435
    USPC .......................................................... 174/256
    See application file for complete search history.

(56) References Cited

U.S. PATENT DOCUMENTS

| | | | | |
|---|---|---|---|---|
| 6,518,667 | B1 * | 2/2003 | Ichida | H01L 23/49816 |
| | | | | 257/734 |
| 7,868,448 | B2 * | 1/2011 | Metzger | H03H 9/059 |
| | | | | 257/729 |
| 7,968,622 | B2 * | 6/2011 | Nishida | G02B 5/201 |
| | | | | 359/892 |
| 8,609,246 | B2 * | 12/2013 | Sun | B23K 35/262 |
| | | | | 428/407 |
| 9,478,326 | B2 * | 10/2016 | Ishida | H01L 24/29 |
| 10,020,274 | B2 * | 7/2018 | Ahn | B23K 35/262 |
| 11,495,566 | B2 * | 11/2022 | Kondoh | B23K 35/262 |
| 2002/0070423 | A1 * | 6/2002 | Takafuji | H05K 1/16 |
| | | | | 257/532 |
| 2003/0090872 | A1 * | 5/2003 | Chu | H01L 23/04 |
| | | | | 257/714 |
| 2003/0119299 | A1 * | 6/2003 | Jiang | H01L 24/16 |
| | | | | 257/E21.511 |
| 2010/0112353 | A1 * | 5/2010 | Sun | C23C 18/34 |
| | | | | 428/407 |
| 2014/0099472 | A1 * | 4/2014 | Greenhill | F41H 5/04 |
| | | | | 427/532 |
| 2015/0008576 | A1 * | 1/2015 | Khandekar | H01L 24/14 |
| | | | | 257/737 |
| 2016/0244891 | A1 | 8/2016 | Son et al. | |
| 2018/0158790 | A1 * | 6/2018 | Ahn | H01L 23/49816 |

OTHER PUBLICATIONS

Foreign Communication from a Related Counterpart Application, Written Opinion dated Dec. 7, 2020, International Application No. PCT/EP2020/075498 filed on Sep. 11, 2020.

* cited by examiner

A

B

COMPOSITE SOLDER BALLS METALLISED ON THE SURFACE AND CALIBRATED FOR THE ASSEMBLY OF ELECTRONIC BOARDS

CROSS-REFERENCE TO RELATED APPLICATIONS

The present application is a filing under 35 U.S.C. 371 as the National Stage of International Application No. PCT/EP2020/075498, filed Sep. 11, 2020, entitled "COMPOSITE SOLDER BALLS METALLISED ON THE SURFACE AND CALIBRATED FOR THE ASSEMBLY OF ELECTRONIC BOARDS," which claims priority to French Application No. 1910055 filed with the Intellectual Property Office of France on Sep. 12, 2019, both of which are incorporated herein by reference in their entirety for all purposes.

TECHNICAL FIELD

The present invention relates, in a general manner, to the manufacture of composite solder balls and the use of said balls as an interconnection solution for the assembly of electronic boards.

BACKGROUND

The search for technologies for the assembly of electronic boards which are more and more miniaturized and do not use lead increasingly prompts the industrial actors in this technological field to seek innovative solutions for implementing the interconnections between components which are sensitive to mechanical stresses, for example ball matrices of the CBGA type ("Ceramic Ball Grid Array), or electromechanical microsystems (conventionally referred to by the acronym MEMS for "Micro Electro Mechanical System").

The flexible balls (as shown in [FIG. 1]) are one of the technologies used for implementing systems in a package, generally referred to by the acronym SiP (for "System In Package"). They comprise contacts to be soldered, allowing for easy assembly thereof in the package.

However, at the present time, the flexible balls currently used in this field have the disadvantage of being formed of a dense core of polymer material, which has a negative impact on the manufacturing costs associated with the outputs of the manufacturing processes, and the calibration of the initial balls, as well as the final density of the ball. Moreover, problems of differential thermal expansion may be encountered between the core and the metal shell of the particles, during subsequent brazing operations.

SUMMARY

In order to overcome this disadvantage, the applicant has developed a method for manufacturing composite solder balls that are metallised on the surface and calibrated, said balls comprising a core consisting of a spherical support particle of diameter $D_0$ made of expanded polystyrene (EPS) and having an intergranular porosity of at least 50%, and a shell covering said support particle and formed by a plurality of metallic surface layers, comprising in particular a copper coating of thickness $E_{cu}$, at least one nickel layer of thickness $E_{Ni}$, and a gold top coat of thickness $E_{AU}$, such that the final particle has a diameter $D_f$.

According to the invention, the method is characterized in that it comprises the following steps:

A) a first step of providing support particles, followed by
B) a first step of granulometric sorting of the support particles consisting in a step of physical and/or mechanical separation of the support particles having a diameter $D_0$, at a tolerance of +/−5%, such that $D_0=D_f-2*(E_{Ni}+E_{cu}+E_{Au})$, it being possible for $D_0$ to be selected so as to be between 200 µm and 1000 µm;
C) a step of activation treatment of the support particles thus selected, in order to obtain activated support particles;
D) a first step of metallization of said activated support particles by means of autocatalytic chemical deposition of one or more layers of copper, said step being repeated until a copper layer thickness $E_{cu}$ of between 15 and 35 µm is obtained, in order to obtain copper-coated support particles;
E) a second step of metallization of the copper-coated support particles by means of autocatalytic chemical deposition of at least one layer of nickel alloyed with phosphorous NiP having a mass percentage of from 7 to 10% phosphorous with respect to the total weight of said layer of NiP, said step being performed until a thickness $E_{Ni}$ of the layer of chemical nickel of between 4 µm and 7 µm is obtained, in order to obtain support particles coated with chemical nickel;
F) a third step of metallization of the support particles coated in chemical nickel (consisting in a step of deposition of gold by means of a method of galvanic displacement implemented by immersion in an aqueous solution containing gold ions (typically implemented in accordance with the prior art), so as to obtain composite solder balls that are metallized and coated on the surface with a gold top coat of a thickness $E_{Au}$ of between 0.05 µm and 0.12 µm;
G) a second step of granulometric sorting of the particles thus metallized in order to sort and select composite solder balls (1) which are metallized on the surface and have a diameter $D_f$, at a tolerance of +/−5%.

The balls made of expanded polystyrene (EPS) have the advantage of being able to reduce in size when they are heated, and thus offer the possibility of being calibrated by heat treatment.

Within the meaning of the present invention, intergranular porosity means the internal porosity of a support particle, at the surface of and/or inside which it is possible to observe different types of pores—channels, networks, "pockets", blind pores, and surface roughness. It can be measured for example by Helium Pycnometry.

A first step of the method according to the invention is the step of providing support particles (step A).

Advantageously, it is possible to use balls of expanded polystyrene (EPS) having a level of intergranular porosity of over 90%.

In the method according to the invention, initially first granulometric sorting of said support particles (step B) is performed, consisting in a step of physical and/or mechanical separation of the support particles (10) having a diameter $D_0$ selected so as to be between 200 µm and 1000 µm. According to an advantageous embodiment of the method according to the invention, the step of granulometric sorting B) of the support particles may consist in mechanical sieving in order to sort and select the support particles having a diameter $D_0$ selected so as to be between 200 µm and 1000 µm. In practice, support particles will be selected that are of a size that corresponds to the target value $D_0$+/−5%.

If balls of expanded polystyrene (EPS) are used as the support particles, the step of granulometric sorting B) of the support particles may consist in mechanical sieving of the support particles. It may then advantageously be completed by heat treatment at a temperature of between 100° C. and 120° C., and preferably between 110° C. and 120° C., of the top slice of the particles thus treated (i.e. the particles, the size of which is greater than $D_0+5\%$), in order to increase the calibration output of the initial population of balls. Indeed, given that the diameter of the expanded polystyrene (EPS) balls reduces when they are heated, if the mechanical sieving is coupled with heating, the sieve oversize of the top slice of the balls previously sorted can thus be reduced in diameter, such that said balls that are initially rejected reach the sought diameter $D_0+/-5\%$. This in particular makes it possible to significantly reduce the production cost, by increasing the output of the number of balls having a diameter $D_0$. Said step of heat treatment may advantageously be conducted in a fluidized bed, by means of gas or by means of liquid, in order to preserve the initial spherical nature of the balls.

At the end of the step of granulometric sorting B), activation treatment (step C) of the support particles previously selected is performed, in order to obtain activated support particles.

Within the meaning of the present invention, activation treatment means treatment consisting in activating the surface of the support particles in order to allow for good adherence of the subsequent metallization treatment.

A first advantageous embodiment of said activation treatment may for example consist in depositing, on the surface of the support particles previously selected, seeds of silver, by way of reduction of silver ions in solution, the silver deposition being achieved by germination-growth. The operation may for example be conducted by reducing an ammoniacal silver nitrate in a glycol-based solution.

Another advantageous embodiment of said activation treatment may also consist in depositing, on the surface of the support particles previously selected, a thin layer of copper of less than or equal to 1 μm, by means of physical vapor deposition (PVD).

Once the support particles are activated, then the actual metallization of the particles takes place (steps D to F).

The first step of metallization (step D) of the activated support particles is a step of autocatalytic chemical deposition of one or more layers of copper, said step being repeated until a copper layer thickness $E_{cu}$ of between 15 μm and 35 μm is obtained, in order to obtain copper-coated support particles. A plurality of successive metallization operations may be necessary in order to obtain the desired thickness of copper.

If it is desired for the solder balls to be hollow or quasi hollow, it is possible to perform, between the metallization steps D and E, either partial or total dissolution, or partial or total thermal decomposition, of the expanded polystyrene (EPS) of the support particles. In order to achieve this, the copper layer formed in step E must then be either sufficiently fine or sufficiently porous to allow the disappearance of the EPS.

The second step of metallization (step E) consists in metallizing the copper-coated support particles obtained at the end of step D) (optionally transformed into hollow or quasi hollow balls) by means of autocatalytic chemical deposition of at least one layer of nickel alloyed with phosphorous NiP having a mass percentage of from 7 to 10% phosphorous with respect to the total weight of the layer of NiP (or chemical nickel). Said step E) is performed until a thickness $E_{Ni}$ of the layer of chemical nickel (111) of between 4 μm and 7 μm is obtained, in order to obtain support particles coated in chemical nickel.

The third step of metallization (step F) consists in metallizing the support particles coated in chemical nickel by immersion in a solution containing gold ions, so as to obtain composite solder balls that are metallized and coated on the surface with a gold top coat of a thickness $E_{AU}$ of between 0.05 μm and 0.12 μm.

Finally, the final step of the method according to the invention (step G) is a second step of granulometric sorting of the particles thus metallized in order to sort and select composite solder balls which are metallized on the surface and have a diameter $D_f$ at a tolerance of +/−5%.

The present invention also relates to solder balls which can be obtained by the manufacturing method according to the invention.

According to a first particularly advantageous embodiment of the invention, the solder balls may have the following features:
diameter $D_0$ of the order of 630 μm+/−5%,
thickness of the copper layer Ecu of the order of 30 μm,
thickness of the NiP layer $E_{Ni}$ of the order of 5 μm,
thickness of the gold layer $E_{AU}$ of between 0.05 μm and 0.12 μm,
diameter $D_f$ of the order of 700 μm+/−5%.

According to a second particularly advantageous embodiment of the invention, the solder balls may have the following features:
diameter $D_0$ of the order of 350 μm+/−5% μm,
thickness of the copper layer Ecu of the order of 20 μm,
thickness of the NiP layer $E_{Ni}$ of the order of 5 μm,
thickness of the gold layer $E_{AU}$ of the order of 0.1 μm,
diameter Df of the order of 400 μm+/−5%.

Advantageously, the solder balls according to the invention may be hollow (or quasi hollow) balls comprising a core made up of more than 50% by volume of polymer material when it is expanded polystyrene (EPS). Such solder balls are obtained using the method according to the invention when said method comprises, between steps D) and E), a step of partial or total dissolution a step of or partial or total thermal decomposition of the expanded polystyrene (EPS) making up the initial support particles.

The present invention also relates to the use of the balls according to the invention for the assembly of electronic boards. Indeed, the structure of the balls according to the invention makes it possible to implement interconnections between components that are sensitive to mechanical stresses (CBGA, MEMS, etc.). They further have the advantage of being able to maintain a controlled position, and to limit the mechanical stresses in the interconnections between the substrate and the components.

BRIEF DESCRIPTION OF THE DRAWINGS

Other features and advantages of the invention will become clear from the following description, given by way of non-limiting example and with reference to the accompanying drawings, in which:

FIG. 1 is described in the presentation of the known prior art. It shows in particular flexible balls having contacts to be welded 1, 2, allowing for easy assembly thereof. FIG. 2 to FIG. 12 are described in greater detail in the following examples, which illustrate the invention without limiting the scope thereof.

DETAILED DESCRIPTION

Figure 4:
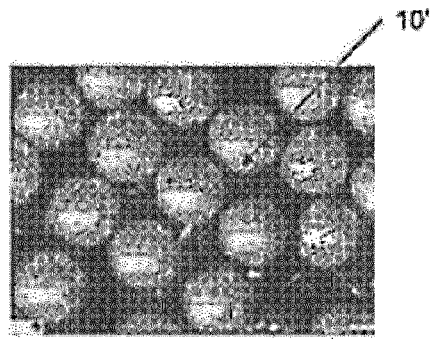
FIG. 4 is a photograph of an activated EPS ball (coated with a thin layer of silver), as obtained at the end of the step C) of activation of the method according to the invention.
Figure 7:
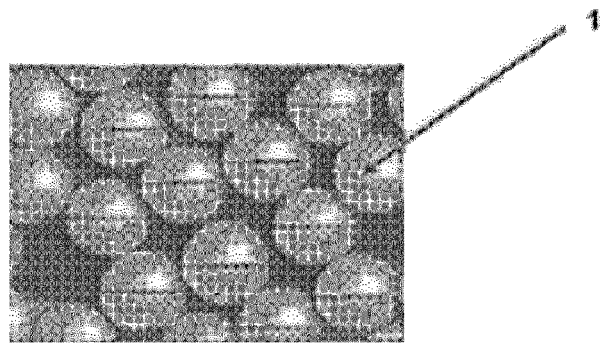
FIG. 7 is a photograph of a solder ball according to the invention, consisting in an activated EPS ball coated successively with layers of copper, chemical nickel (NiP) and gold, as obtained at the end of the step F) of metallization with chemical nickel of the method according to the invention.

Devices and Instrumentation
    Autocatalytic chemical deposition device (for the deposition of copper and of chemical nickel);
    Mechanical sieving device
Starting Products
    Expanded polystyrene (EPS) balls of diameter of between 595 µm and 665 µm;
    Expanded polystyrene (EPS) balls of diameter of the order of 400 µm,
    Chemical nickel (containing 7 to 10 wt. % P),
    Copper
    Silver nitrate,
    Gold ions.
Characterization: Morphological Analysis The optical microscope observations are performed using an optical microscope, at the surface ([FIG. 4] to [FIG. 7]) and in cross section ([FIG. 8] and [FIG. 9]).

Figure 12:
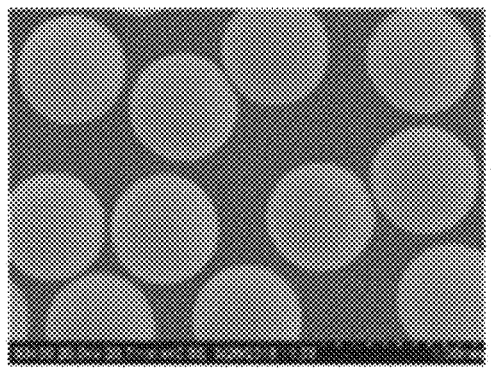
FIG. 12 is a SEM image showing metallized balls 1 according to the invention prior to heat treatment at 360° C. (A), and a SEM image showing metallized balls 1 according to the invention having been subjected to subsequent heat treatment at 360° C. for 20 minutes (B) in order to verify the thermal resistance of the balls.
Figure 12:
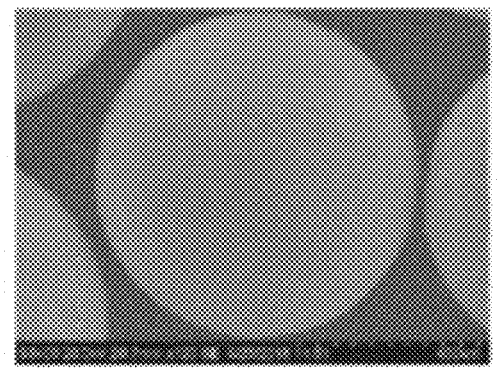
Figure 12:
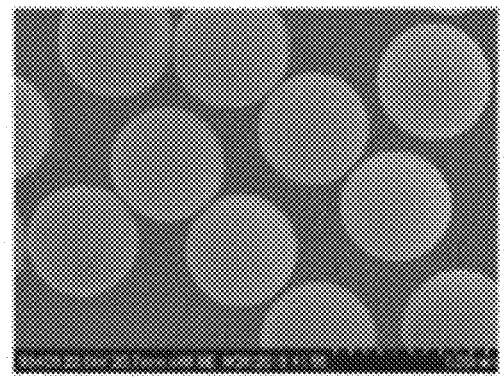
Figure 12:
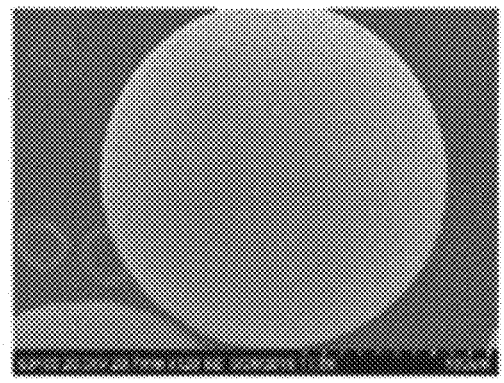
Figure 13:
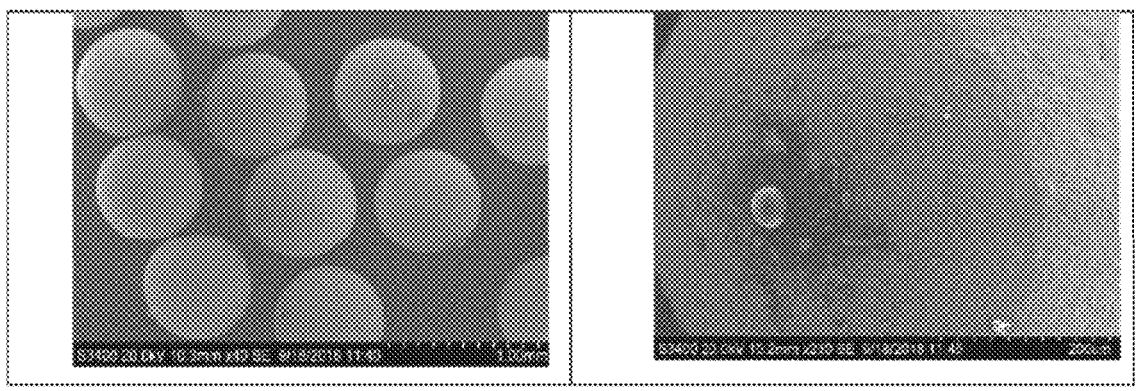
FIG. 13 is a SEM image showing balls having a dense polystyrene core which have been metallized in accordance with steps A to G of the method according to the invention and which have been subjected to subsequent heat treatment at 360° C. for 20 minutes (B) in order to verify the thermal resistance of the balls.

The observations of FIGS. 12 and 13 are obtained using a scanning electron microscope (SEM).

Example 1

Figure 2:
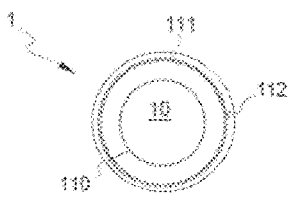
FIG. 2 is a schematic view of an example of a flexible ball according to the invention.
Figure 3:
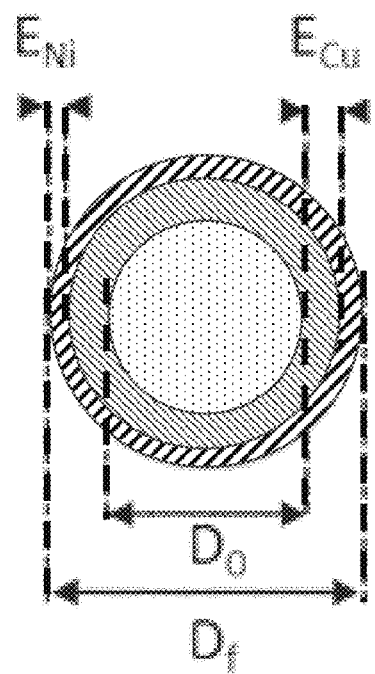
FIG. 3 is also a schematic view of an example of a flexible ball according to the invention, but in which, for reasons of clarity, the surface layer of gold is not shown.
Figure 5:
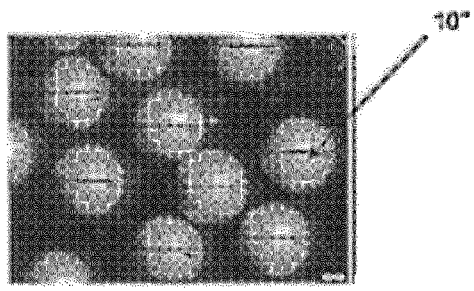
FIG. 5 is a photograph of an activated EPS ball coated with a layer of copper, as obtained at the end of the step D) of metallization with copper of the method according to the invention.
Figure 6:
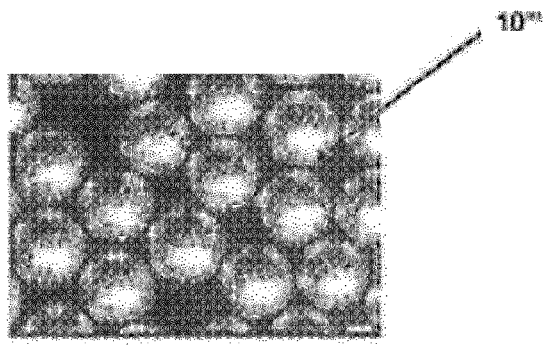
FIG. 6 is a photograph of an activated EPS ball coated successively with layers of copper and of chemical nickel (NiP), as obtained at the end of the step E) of metallization with chemical nickel of the method according to the invention.
Figure 9:
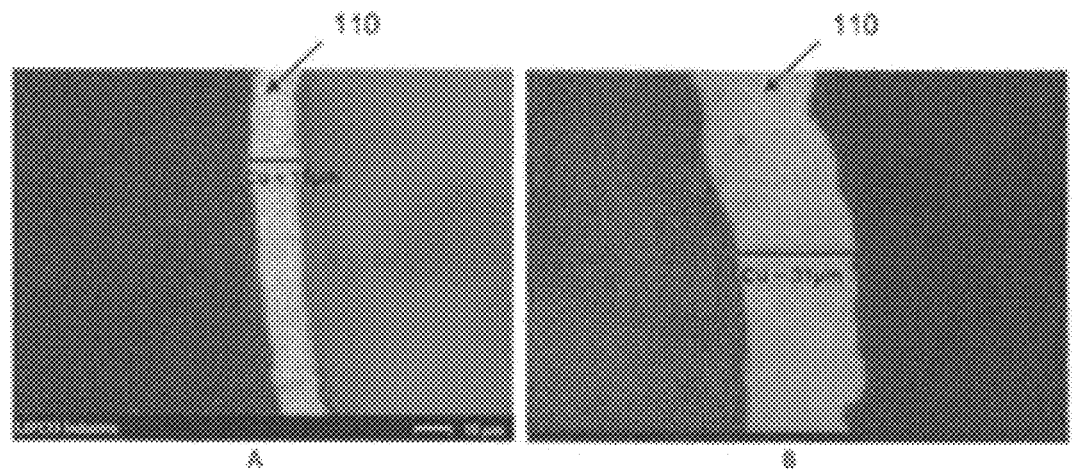
FIG. 9 shows a first optical microscope image (A) of a cross section of a copper-coated EPS ball as obtained at the end of step D) of a second embodiment of the method according to the invention (EPS ball of 660 µm diameter and copper layer of 15 µm thickness), and a second optical microscope image (B) of a cross section of a copper-coated EPS ball as obtained at the end of step D) of a third embodiment of the method according to the invention (EPS ball of 630 µm diameter and copper layer of 31 µm thickness)
Figure 10:
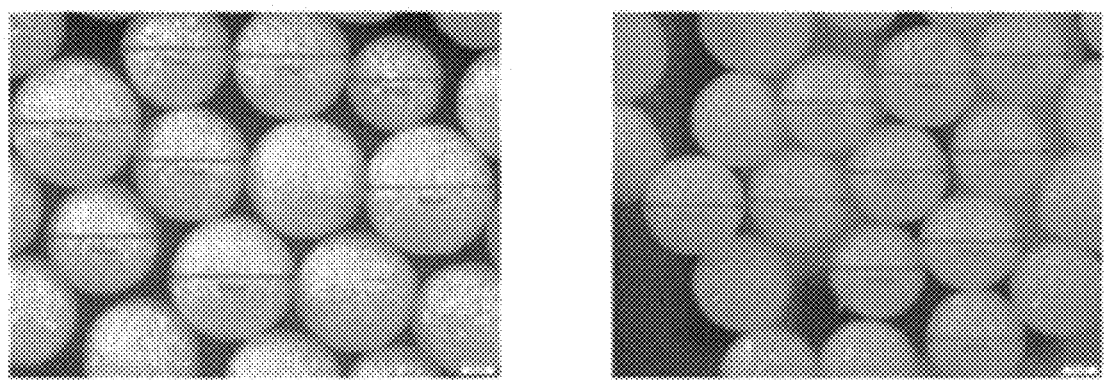
FIG. 10 shows a first optical microscope image A showing EPS support balls having a size distribution $D_0$ of between 0.5 and 1 mm, and a second optical microscope image B showing EPS support balls 10 obtained after granulometric sorting selecting diameters of between 0.63 and 0.66 mm.
Figure 11:
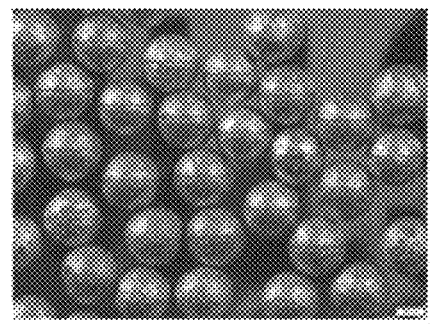
FIG. 11 shows metallized balls 1 according to the invention, having diameters of the order of 400 µm+/−5%.

Manufacture of Solder Balls According to the Invention, in Accordance with a First Embodiment of the Method According to the Invention, Solder balls according to the invention are developed from expanded polystyrene (EPS) balls according to a first embodiment of the method according to the invention. The manufacturing is split according to the following steps:

1) A first mechanical sieving of EPS balls 10 having a size distribution of between 0.5 and 1 mm is performed, in order to keep just the balls of a diameter of the order of 630 µm ([FIG. 10]);
2) Then, the surface of the EPS grains is activated in order to allow for good adherence of the subsequent metallization treatment. The activated ball 10' is obtained by depositing silver seeds on the surface of the balls. The operation is performed in a bath, by reduction of the silver nitrate. At the end of this treatment, a ball 10' is obtained as shown in [FIG. 4];
3) The third step consists in performing the metallization treatment using copper. A layer of copper 110 of 30 µm thickness $E_{cu}$ is obtained by means of autocatalytic chemical deposition (cf. [FIG. 2], [FIG. 3]). At the end of this treatment, a ball 10" is obtained as shown in [FIG. 5] (surface view) or in [FIG. 9], part B (cross-sectional view);

The fourth step consists in depositing a layer of chemical nickel (NiP) 111 of 5 µm thickness on the layer of copper 110 (cf. [FIG. 2], [FIG. 3]). Said coating is also implemented by means of autocatalytic chemical deposition. At the end of this treatment, a ball 10—is obtained as shown in [FIG. 6];

The last metallization layer is a top coat 112 of gold (cf. [FIG. 2]). The deposition is obtained by galvanic displacement following immersion of the chemical nickel-coated balls 10—in a solution containing gold ions. A layer of gold is thus deposited, the thickness Eau of which is between 0.05 µm and 0.12 µm (cf. [FIG. 2]). At the end of this treatment, a solder ball 1 is obtained as shown in [FIG. 7];

The final step is granulometric sorting of the balls in order to keep only the balls according to the invention 1 of diameter $D_f$ of the order of 700 µm+/−5%.

Example 2

Figure 8:
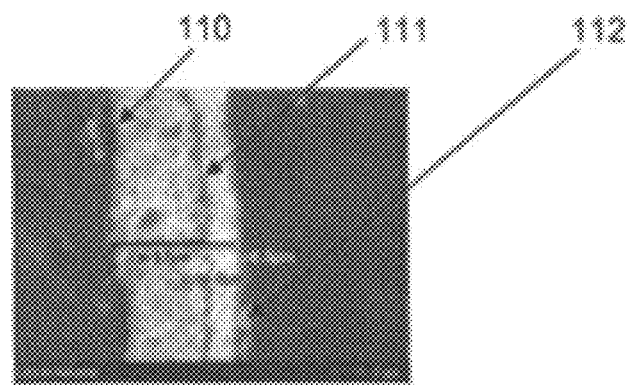
FIG. 8 is an optical microscope image of a cross section of a ball according to the invention, showing the EPS support ball and the successive layers of copper, chemical nickel and gold, as obtained at the end of a first embodiment of the method according to the invention (EPS ball of approximately 655 µm diameter, and copper layer of 17 µm thickness)

Manufacture of Solder Balls According to the Invention, in Accordance with a Second Embodiment of the Method According to the Invention Solder balls according to the invention are formed in the same way as in example 1, having support balls of 660 µm diameter and a deposition of copper of the order of 15 to 17 mm thickness (cf. FIGS. 8 and 9A).

Example 3

Manufacture of Solder Balls According to the Invention, in Accordance with a Third Embodiment of the Method According to the Invention Solder balls according to the invention are formed in the same way as in examples 1 and 2, in order to obtain balls of diameter $D_f$ of the order of 400 µm+/−5% (cf. [FIG. 12]).

Example 4

Effect of Heat Treatment after the Step of Sieving

The SEM analyses ([FIG. 12]) show balls that are metallized and calibrated according to the invention, before (12a) and after heat treatment at 360° C. (12b). It is noted that the balls have not undergone deterioration/modifications following the heat treatment, demonstrating their temperature stability.

Example 5 (Comparative)

In order to establish a comparative analysis of the weight of the balls 3, batches of balls (of diameter $D_0$ 700 µm+/−5%) were formed according to steps A to G of the method according to the present invention (Cu/NiP/Au metallization), then subjected to subsequent heat treatment at 360° C. for 20 minutes (B) in order to verify the thermal resistance of the balls. In order to achieve this, 3 different types of support balls were used:
- a first batch formed based on expanded polystyrene balls (exhibiting approximately 95% porosity),
- a second batch formed based on crosslinked polystyrene balls (dense), and
- a third batch formed based on metal copper balls (dense).

For each batch, 1000 balls were removed and weighed. The following results were obtained, summarized in table 1 below:

TABLE 1

| Support balls | Weight for 1000 metallized balls (g) |
| --- | --- |
| Expanded polystyrene | 0.225 |
| Dense polystyrene | 0.390 |
| Dense copper | 2.100 |

The balls formed according to the present invention based on expanded polystyrene (first batch) have a mass reduction factor of between 1.7 and 9.4 compared with the current solutions (dense core made of organic or metal material).

Figure 1:
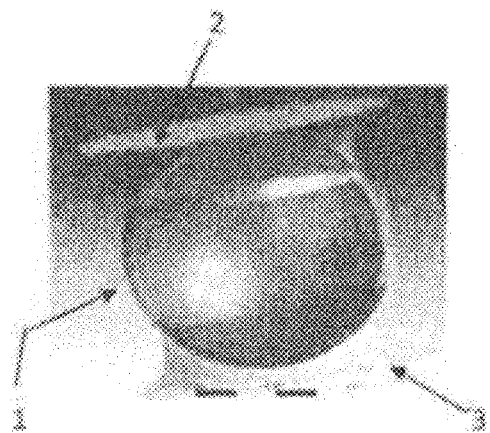
FIG. 1 is a schematic view of an example of a flexible ball known from the prior art, comprising contacts to be soldered for assembly thereof in integrated circuit housings.

On the other hand, it has been noted that the thermal stability of the balls is improved by using an EPS core (balls according to the invention, of the first batch) compared with the balls obtained on the basis of a dense core (balls of the second and third batches). Indeed, it is noted that, from 360° C., the balls formed based on dense polystyrene (balls of the second and third batches) exhibit a behavior defect, with the appearance of "droplets" of organic material on the surface of the balls (FIG. 1). The phenomenon is not observed in the balls according to the invention formed on the basis of expanded polystyrene (balls of the first batch).

The invention claimed is:

1. A method for manufacturing composite solder balls metallized on a surface and calibrated, of diameter $D_f$, said composite solder balls comprising:
   - a core consisting of a spherical support particle of diameter $D_0$, made of expanded polystyrene (EPS) and having an intergranular porosity of at least 50%, and
   - a shell that covers said support particle and is formed by a plurality of metallic surface layers, comprising a copper coating of thickness $E_{cu}$, at least one nickel layer of thickness $E_{Ni}$, and a gold top coat of thickness $E_{AU}$, said method comprising:

providing support particles, followed by:

granulometric sorting of the support particles consisting of physical and/or mechanical separation of the support particles having a diameter $D_0$ such that $D_0=D_f-2*(E_{Ni}+E_{cu}+E_{Au})$, wherein $D_0$ is between 200 µm and 1000 µm;

activating treatment of the support particles thus selected to obtain activated support particles;

metallizing said activated support particles by means of autocatalytic chemical deposition of one or more layers of copper, and repeating metallizing until a copper coating of thickness $E_{cu}$ of copper of between 15 and 30 µm to obtain copper-coated support particles;

metallizing the copper-coated support particles by means of autocatalytic chemical deposition of at least one layer of nickel alloyed with phosphorous NiP having a mass percentage of from 7 to 10% phosphorous with respect to the total weight of said layer of NiP, performing until a thickness ENi of the layer of chemical nickel of between 4 µm and 7 µm is obtained, to obtain support particles coated with chemical nickel;

metallizing the support particles coated in chemical nickel consisting of depositing gold by means of a method of galvanic displacement implemented by immersion in an aqueous solution containing gold ions, to obtain composite solder balls metallized and coated on the surface with a gold top coat of a thickness $E_{AU}$ of between 0.05 µm and 0.12 µm; and granulometric sorting the metallized particles in order to sort and select composite solder balls metallized on the surface and have a diameter $D_f$ at a tolerance of +/−5%.

2. The method according to claim 1, wherein the granulometric sorting of the support particles consists in mechanical sieving to sort and select the support particles having a diameter $D_0$ between 200 µm and 1000 µm.

3. The method according to claim 2, wherein the granulometric sorting of the support particles is followed by heat treatment at a temperature of between 100° C. and 120° C., of the top portion of the particles thus treated, the size of which is greater than $D_0+5\%$.

4. The method according to claim 1, wherein the activation treatment of the support particles consists in depositing silver seeds on the surface thereof, by means of introduction into a bath of silver nitrate, or by depositing, on the surface thereof, a thin layer of copper of less than or equal to 1 µm, by means of physical vapor deposition (PVD).

5. The method according to claim 1, further comprising, between metallizing said activated support particles and metallizing the copper-coated support particles, partially or totally dissolving the expanded polystyrene (EPS) of the support particles, or partially or totally thermally decomposing the expanded polystyrene (EPS) of the support particles.

6. An electronic board comprising composite solder balls metallized on the surface and calibrated, of diameter $D_f$, obtained by the method of claim 1.

* * * * *